(12) United States Patent
Liu et al.

(10) Patent No.: US 8,188,527 B2
(45) Date of Patent: May 29, 2012

(54) EMBEDDED CAPACITOR IN SEMICONDUCTOR DEVICE AND METHOD FOR FABRICATING THE SAME

(75) Inventors: Ming-Chyi Liu, Hsinchu (TW); Chi-Hsin Lo, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 113 days.

(21) Appl. No.: 11/422,701

(22) Filed: Jun. 7, 2006

(65) Prior Publication Data

US 2007/0287247 A1    Dec. 13, 2007

(51) Int. Cl.
*H01L 27/108* (2006.01)

(52) U.S. Cl. ........ 257/303; 257/296; 257/301; 257/306; 257/E27.084; 438/244

(58) Field of Classification Search .................. 257/303, 257/E27.084, 296, 301, 306; 438/244
See application file for complete search history.

(56) References Cited

U.S. PATENT DOCUMENTS

| | | | |
|---|---|---|---|
| 5,723,375 A * | 3/1998 | Ma et al. | 438/258 |
| 6,078,492 A * | 6/2000 | Huang et al. | 361/301.4 |
| 6,143,601 A * | 11/2000 | Sun | 438/253 |
| 6,184,082 B1 | 2/2001 | Hsieh | |
| 6,222,215 B1 * | 4/2001 | Zahurak | 257/296 |
| 6,376,366 B1 | 4/2002 | Lin et al. | |
| 7,224,014 B2 * | 5/2007 | Ichimura | 257/301 |
| 2004/0056324 A1 | 3/2004 | Ning et al. | |
| 2004/0175932 A1 | 9/2004 | Kim et al. | |
| 2004/0253784 A1 | 12/2004 | Lu et al. | |
| 2005/0124114 A1 | 6/2005 | Ichimura | |

OTHER PUBLICATIONS

TW Office Action mailed Jun. 29, 2009.

* cited by examiner

*Primary Examiner* — Matthew E Warren
*Assistant Examiner* — John Lin
(74) *Attorney, Agent, or Firm* — Thomas|Kayden

(57) ABSTRACT

A semiconductor device with an embedded capacitor structure. A dielectric layer is disposed on a substrate, having a contact opening exposing the substrate and a trench opening above the contact opening. A first metal electrode layer is conformally disposed over the sidewalls and bottoms of the contact and trench openings. A second metal electrode layer is conformally disposed over the sidewalls and bottoms of the contact and trench openings. A capacitor dielectric layer is interposed between the first and second metal electrode layers. A method for fabricating the semiconductor device is also disclosed.

5 Claims, 12 Drawing Sheets

US 8,188,527 B2

EMBEDDED CAPACITOR IN SEMICONDUCTOR DEVICE AND METHOD FOR FABRICATING THE SAME

BACKGROUND OF THE INVENTION

1. Field of the Invention

The present invention relates to a semiconductor memory technology, and in particular to a semiconductor device with a metal-insulator-metal capacitor structure in a semiconductor device and a method for fabricating the same.

2. Description of the Related Art

Semiconductor memory devices are commonly available in various forms, such as EPROMs, EEPROMs, flash memories, and DRAMs. Currently, DRAM is widely applied in large capacity memory technology. DRAM is typically a volatile memory consisting of a transistor and a capacitor. Digital signals are stored or erased by charging and discharging capacitor in the DRAM. Accordingly, improvement of the capacitor structure tends to be the direction in which semiconductor memory technology is developing.

In recent years, in order to satisfy demands for high density DRAM cells in a semiconductor chip, the size of the DRAM cell has been miniaturized. That is, the used space of the capacitor for conventional DRAM structure is reduced. More memory capacity is required, however, to accommodate large size computer software. There are several approaches to reduce the size of the capacitor while increasing memory capacity. For example, a high dielectric constant (K) material can be employed as a capacitor dielectric to increase the capacitance. Additionally, increasing the surface area of the capacitor in a limited space also can increase capacitance.

BRIEF SUMMARY OF INVENTION

A detailed description is given in the following embodiments with reference to the accompanying drawings. A semiconductor device with an embedded capacitor structure and a method for fabricating the same are provided. An embodiment of semiconductor device with an embedded capacitor structure comprises a dielectric layer disposed on a substrate, wherein the dielectric layer has a contact opening exposing the substrate and a trench opening above the contact opening. A first metal electrode layer is conformally disposed over the sidewalls and bottoms of the contact and trench openings. A second metal electrode layer is conformally disposed over the sidewalls and bottoms of the contact and trench openings. A capacitor dielectric layer is interposed between the first and second metal electrode layers.

An embodiment of a method for fabricating a semiconductor device with an embedded capacitor structure comprises depositing a dielectric layer on a substrate. A contact opening is formed in the lower portion of the dielectric layer to expose the substrate and a trench opening is formed above the contact opening. A first metal electrode layer is conformally formed over the sidewalls and bottoms of the contact and trench openings. A capacitor dielectric layer is conformally formed on the first metal electrode layer. A second metal electrode layer is conformally formed on the capacitor dielectric layer.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The semiconductor device with an embedded capacitor structure of the invention will be described in the following with reference to the accompanying drawings.

Figure 1:
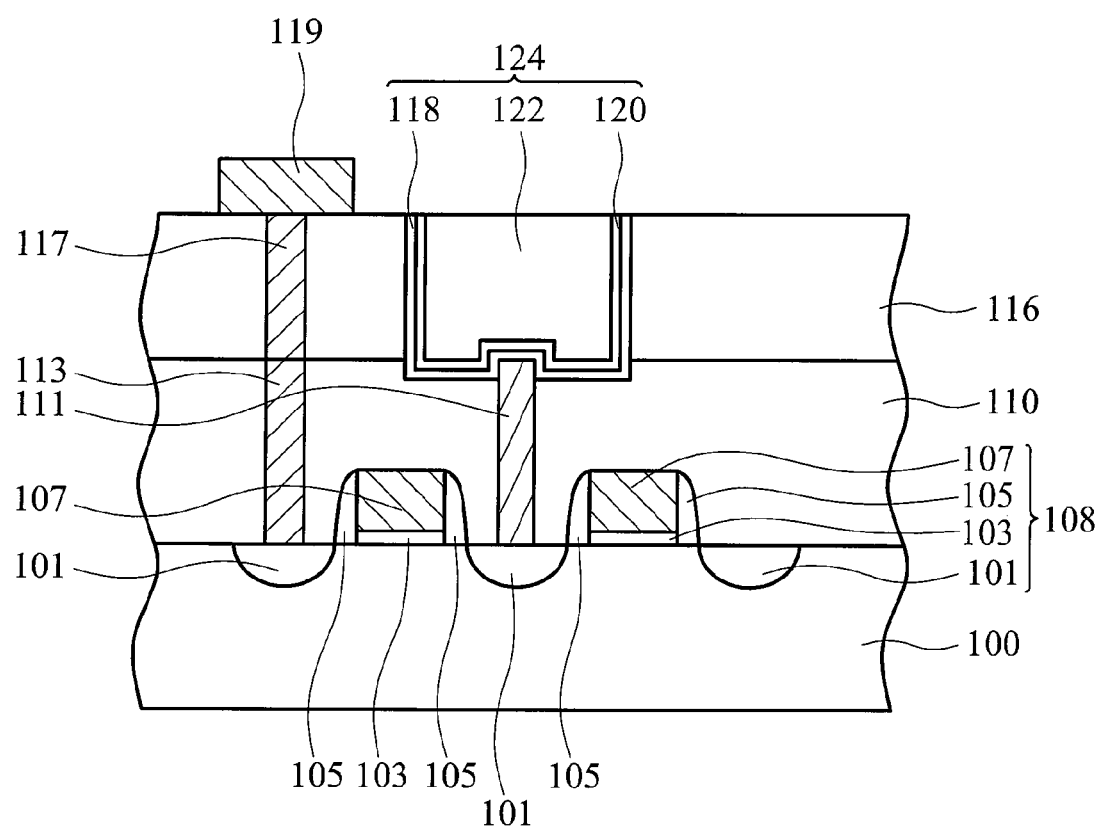
FIG. 1 shows a cross-section of a semiconductor device with an embedded capacitor structure known to the inventors.

FIG. 1 illustrates a semiconductor device with an embedded capacitor structure known to the inventors, such as a DRAM cell. This is not prior art for the purpose of determining the patentability of the invention. This merely shows a problem founded by the inventors.

As shown in FIG. 1, the DRAM cell comprises a substrate 100 having a pair of transistors 108 formed thereon. Each transistor 108 includes source/drain regions 101 formed in the substrate 100, a gate dielectric layer 103, a gate electrode 107 and gate spacers 105. A first dielectric layer 110, serving as an interlayer dielectric (ILD) layer, is deposited on the substrate 100. Plugs 111 and 113, such tungsten plugs, are disposed in the first dielectric layer 110. The plug 111 disposed between the pair of the transistors 108 and connected to one source/drain region 101 serves as a capacitor node contact. The other plug 113 connected to another source/drain region 101 serves as a portion of bit line contact. A second dielectric layer 116, serving as another ILD layer, is deposited on the first dielectric layer 110. A plug 117 disposed in the second dielectric layer 116 and electrically connected to the plug 113 serves as another portion of bit line contact. A capacitor 124, such as a metal-insulator-metal (MIM) capacitor, is embedded in the second dielectric layer 116 and a portion of the first dielectric layer 110 and electrically connected to the plug 111. The MIM capacitor 124 includes a bottom electrode layer 118, a top electrode layer 122 and a capacitor dielectric layer 120 interposed therebetween. A conductive layer 119 is disposed on the second dielectric layer 116 and electrically connected to the plug 117 to serve as a bit line.

As mentioned, in order to increase memory capacity, the capacitance of the capacitor 124 must be increased. Therefore, the capacitor 124 is designed to have a crown shape. However, poor deposition of the bottom electrode layer 118 due to a protruding plug 111 (i.e. capacitor node contact) under the crown capacitor 124, results in increased leakage current thus reducing memory device refresh time and device reliability.

The invention relates to an improved embedded capacitor structure in a semiconductor device, such as a DRAM cell, which can further increase capacitance of the capacitor while preventing occurrence of leakage current, increasing device reliability and memory capacity.

Figure 2A:
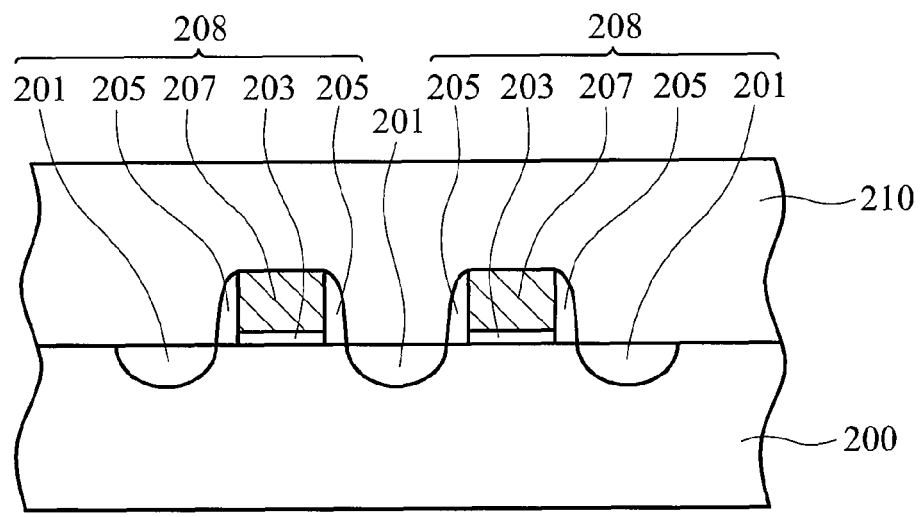
FIGS. 2A through 2H show cross-sections of an embodiment of a method for fabricating a semiconductor device with an embedded capacitor structure.
Figure 2B:
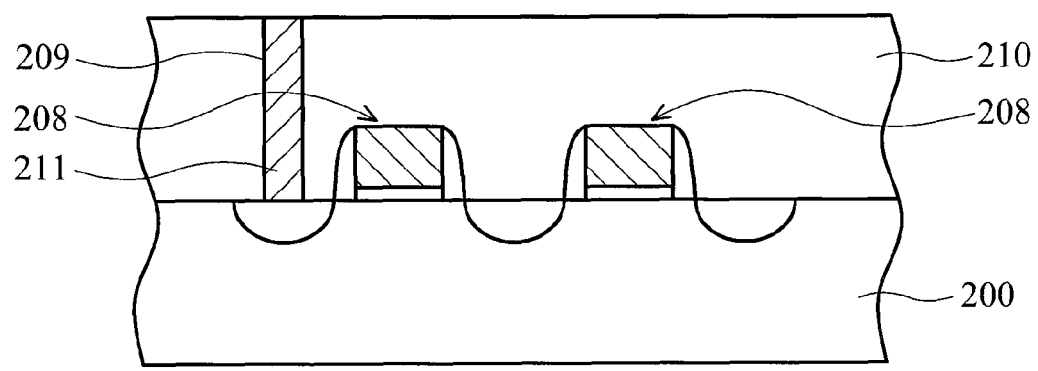
Figure 2C:
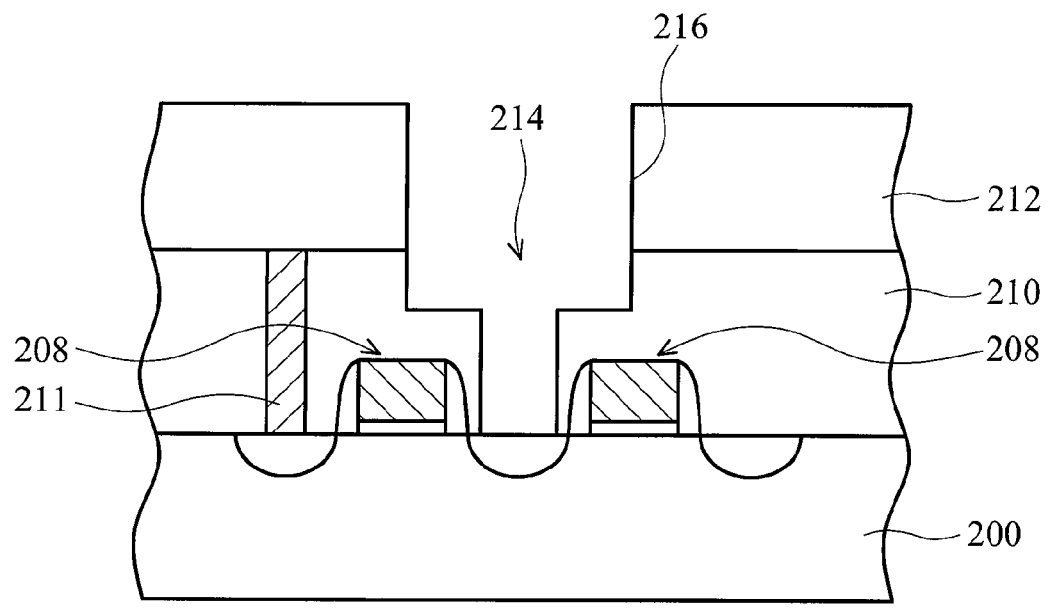
Figure 2D:
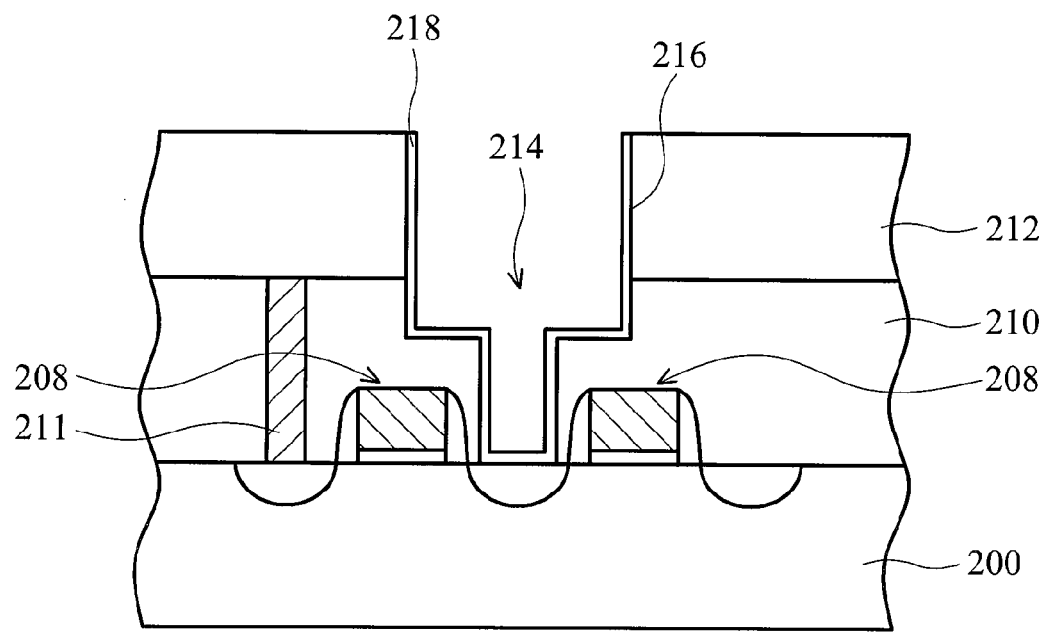
Figure 2E:
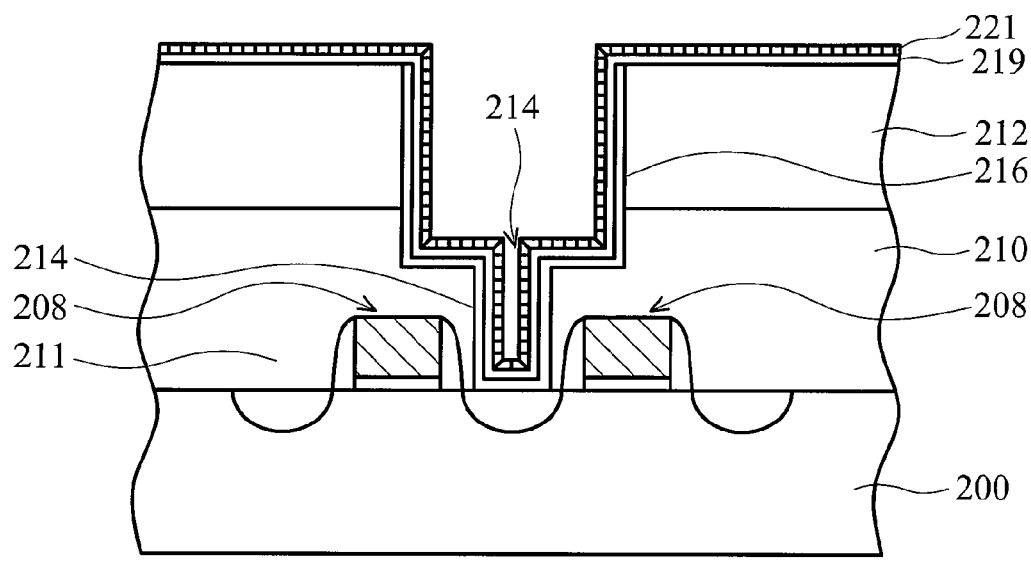
Figure 2F:
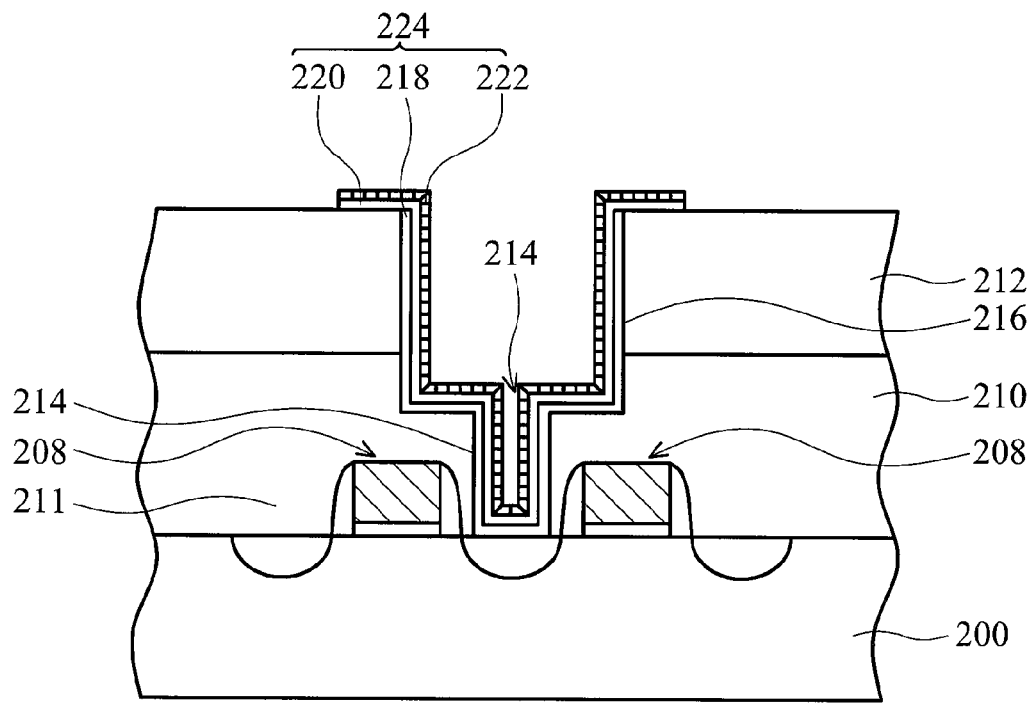
Figure 2G:
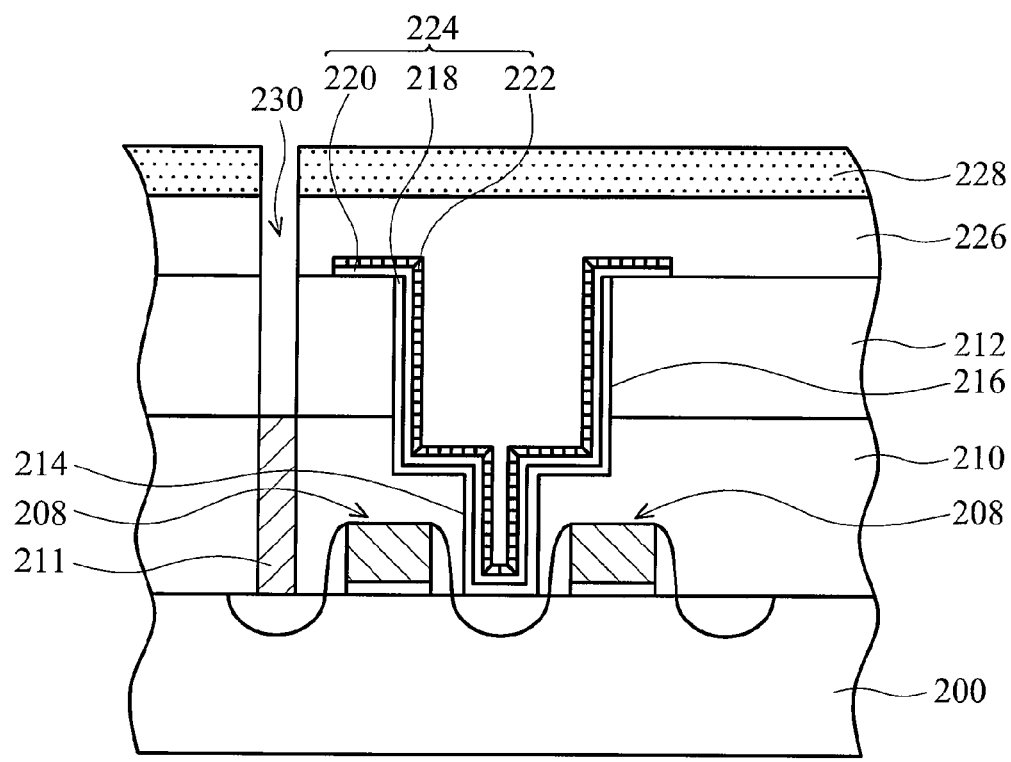
Figure 2H:
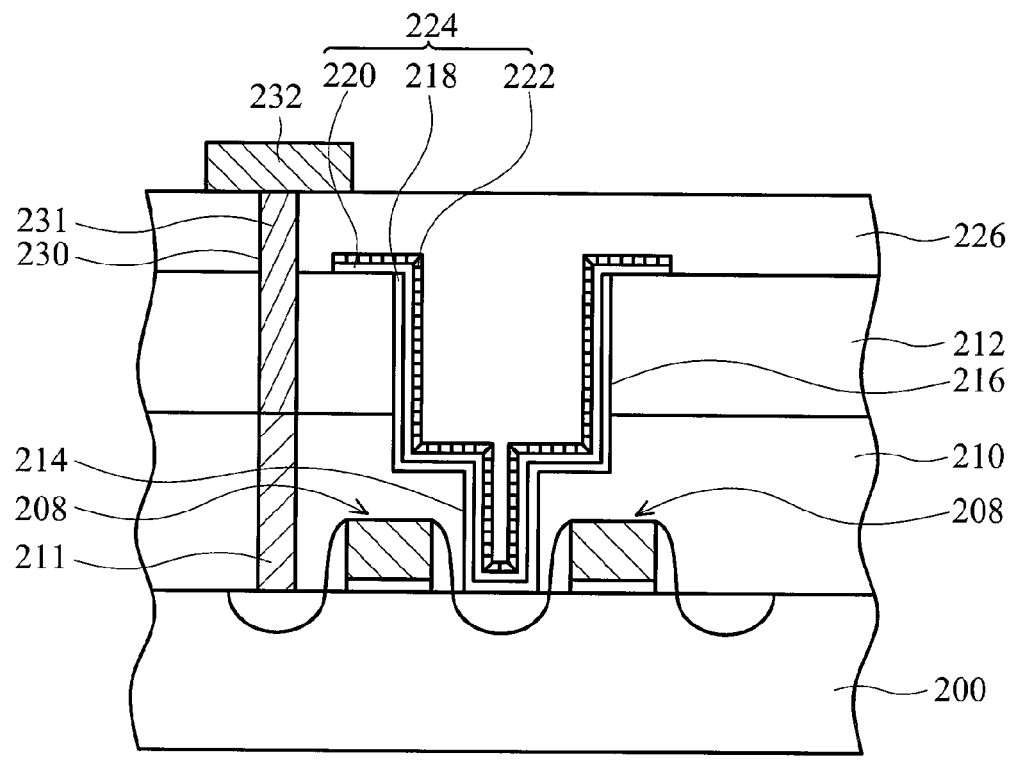

FIG. 2H illustrates a semiconductor device with an embedded capacitor structure. The semiconductor device, such as a DRAM cell, comprises a substrate 200 having at least one transistor formed thereon. For example, a pair of transistors 208 is formed on the substrate 200. Typically, each transistor 208 comprises a gate structure on the substrate 200 and source/drain regions in the substrate 200. A dielectric layer covers the transistors 208 and the substrate 200 to serve as an ILD layer. In this embodiment, the dielectric layer may comprise a single layer or multiple layers. For example, the dielectric layer comprises a first dielectric layer 210 and an overlying second dielectric layer 212. The first dielectric layer 210 comprises a contact opening 214 between the pair of transistors 208, exposing the substrate 200 to serve as a capacitor node contact opening. Moreover, a plug 211 is disposed in the first dielectric layer 210 and electrically connected to one of the transistors 208 to serve as a portion of the bit line contact. The second dielectric layer 212 comprises a trench opening 216 above the contact opening 214, in which the trench opening 216 may be further recessed into the first dielectric layer 210.

An embedded capacitor 224 is disposed in the contact and trench openings 214 and 216. In this embodiment, the embedded capacitor 224 comprises a bottom metal electrode layer 218 conformally disposed over the sidewalls and bottoms of the contact and trench openings 214 and 216, a top metal electrode layer 222 conformally disposed over the sidewalls and bottoms of the contact and trench openings 214 and 216 and partially extending on the top surface of the second dielectric layer 212, and a capacitor dielectric layer 220 interposed between the bottom and top metal electrode layers 218 and 222. The bottom metal electrode layer 218 on the bottom of the contact opening 214 is in contact with a common source/drain region of the pair of the transistors 208, such that the capacitor 224 is electrically connected to the pair of the transistors 208. In this embodiment, the bottom metal electrode layer 218 may comprise a metal diffusion barrier material, such as tantalum (Ta), tantalum nitride (TaN), titanium (Ti), titanium nitride (TiN) or a combination thereof. The top metal electrode layer 222 may comprise aluminum (Al), tantalum (Ta), tantalum nitride (TaN), titanium (Ti), or titanium nitride (TiN). The capacitor dielectric layer 220 may comprise a high dielectric constant (K) material, such as $Ta_2O_5$, $HfO_2$, $ZrO_2$, or $Al_2O_3$.

A capping layer 226 comprising oxide or the same material as the ILD layer is disposed on the second dielectric layer 212 and fills the trench and contact openings 216 and 214 to cover the embedded capacitor 224. Moreover, a plug 231 is disposed in the capping layer 226 and the underlying second dielectric layer 212 and in contact with the plug 211 to serve as another portion of the bit line contact. A conductive layer 232, such as a doped polysilicon layer, is disposed on the capping layer 226 and electrically connected to the plug 231 to serve as a bit line.

FIGS. 2A through 2H show a series of schematic cross-sections illustrating an embodiment of a method for fabricating a semiconductor device with an embedded capacitor structure. As shown in FIG. 2A, a substrate 200, such as a silicon substrate or other semiconductor substrate, is provided. At least one transistor is formed on the substrate 200. For example, a pair of transistors 208 is provided on the substrate 200 for DRAM fabrication. Typically, each transistor 208 comprises source/drain regions 201 formed in the substrate 200 and a gate structure formed on the substrate 200 and comprising a gate dielectric layer 203, a gate electrode 207 and gate spacers 205. Next, a first dielectric layer 210 is deposited on the substrate 200 and covers the transistors 208 by conventional deposition technology, serving as an ILD layer. For example, the first dielectric layer 210 may comprise tetraethyl orthosilicate (TEOS) oxide formed by CVD. Moreover, the first dielectric layer 210 has a thickness of about 4000 Å to 5000 Å.

As shown in FIG. 2B, the first dielectric layer 210 is patterned by conventional lithography and etching to form a contact opening 209 exposing one source/drain region 201 formed in the substrate 200. A conductive material is filled in the contact opening 209 to form a plug 211 serving as a portion of the bit line contact. The conductive material may comprise tungsten (W), copper (Cu), aluminum (Al) or doped polysilicon, and tungsten is preferred.

As shown in FIG. 2C, a second dielectric layer 212 is deposited on the first dielectric layer 210 by conventional deposition technology, serving as a second ILD layer. For example, the second dielectric layer 212 may comprise the same material as the first dielectric layer 210 or different material therefrom, such as boron phosilicate glass (BPSG) or phososilicate glass (PSG). In this embodiment, the second dielectric layer 212 comprises the same material as the first dielectric layer 210. Moreover, the second dielectric layer 212 has a thickness of about 4000 Å to 5000 Å. Thereafter, first and second dielectric layers 210 and 212 are patterned to form a contact opening 214 exposing the common source/drain region 201 formed in the substrate 200 between the pair of the gate structures and form a trench opening 216 above the contact opening 214. The contact opening 214 is substantially formed in the first dielectric layer 210 and the trench opening 216 is formed in the second dielectric layer 212 and recessed into a portion of the first dielectric layer 210.

Figure 3A:
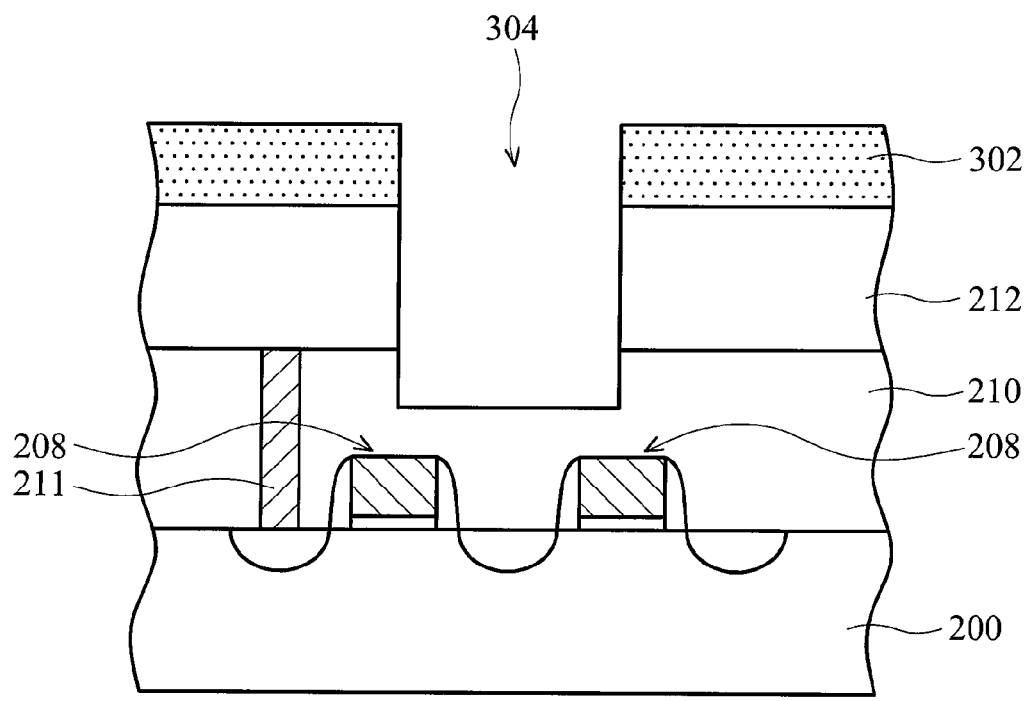
FIGS. 3A through 3B show cross-sections of an embodiment of a method for forming a dual damascene opening shown in FIG. 2C.
Figure 3B:
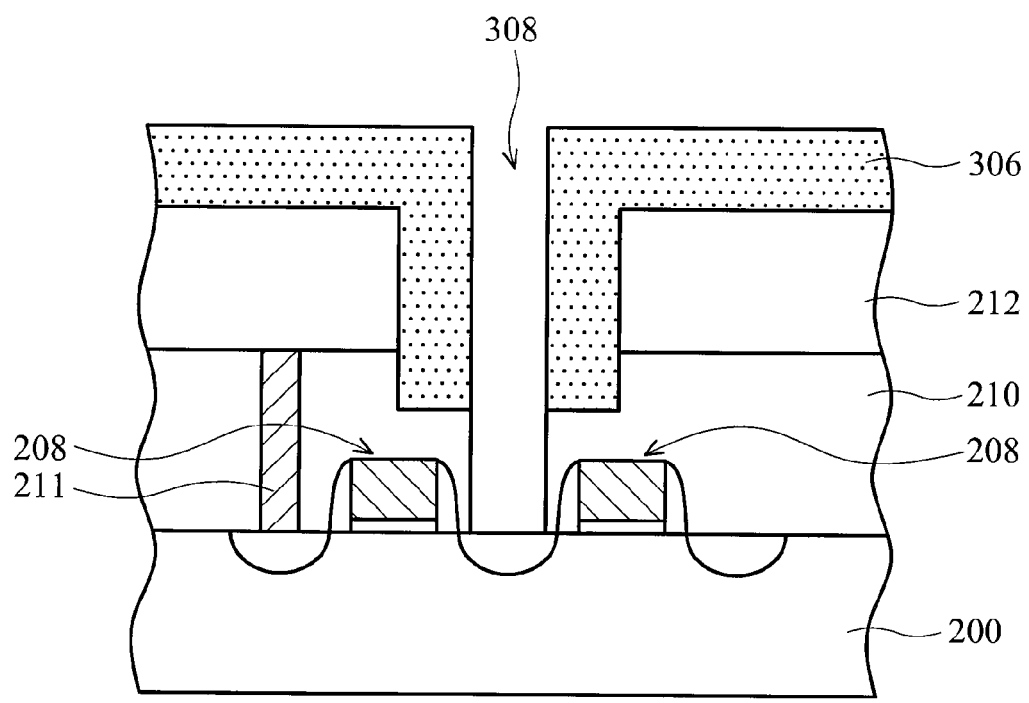

The contact and trench openings 214 and 216 can be formed by various methods. FIGS. 3A through 3B show cross-sections of an embodiment of a method for forming the contact and trench openings 214 and 216 shown in FIG. 2C. In FIG. 3A, a masking layer 302, such as a photoresist layer, is formed on the second dielectric layer 212. The masking layer 302 is subsequently patterned to form an opening therein for trench opening definition. The opening is transferred to the second dielectric layer 212 by etching to form a first opening 304 therein. The first opening 304 in the second dielectric layer 212 may be further recessed into a portion of the first dielectric layer 210 by etching to serves as the trench opening 216 shown in FIG. 2C. In FIG. 3B, after removal of the masking layer 302, another masking layer 306, such as a photoresist layer, is formed on the second dielectric layer 212 and fills the first opening 304. The masking layer 306 is subsequently patterned for contact opening definition, thus a relatively narrow opening with respect to the first opening 304 is formed in the masking layer 306 to expose the bottom of the first opening 304. Next, the relatively narrow opening is transferred to the first dielectric layer 210 by etching to form a second opening 308 therein to expose the common source/drain region 201 between the pair of gate structures and serve as the contact opening 214 shown in FIG. 2C. Thereafter, the masking layer 306 is removed, as shown in FIG. 2C.

Figure 4A:
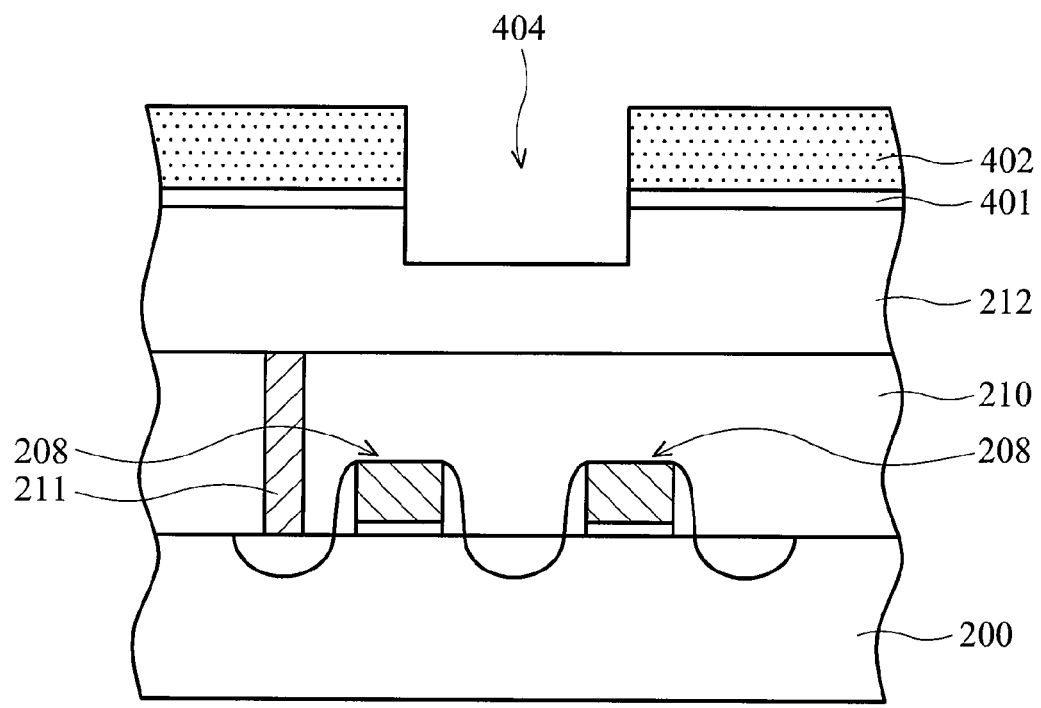
FIGS. 4A through 4C show cross-sections of another embodiment of a method for forming a dual damascene opening shown in FIG. 2C.
Figure 4B:
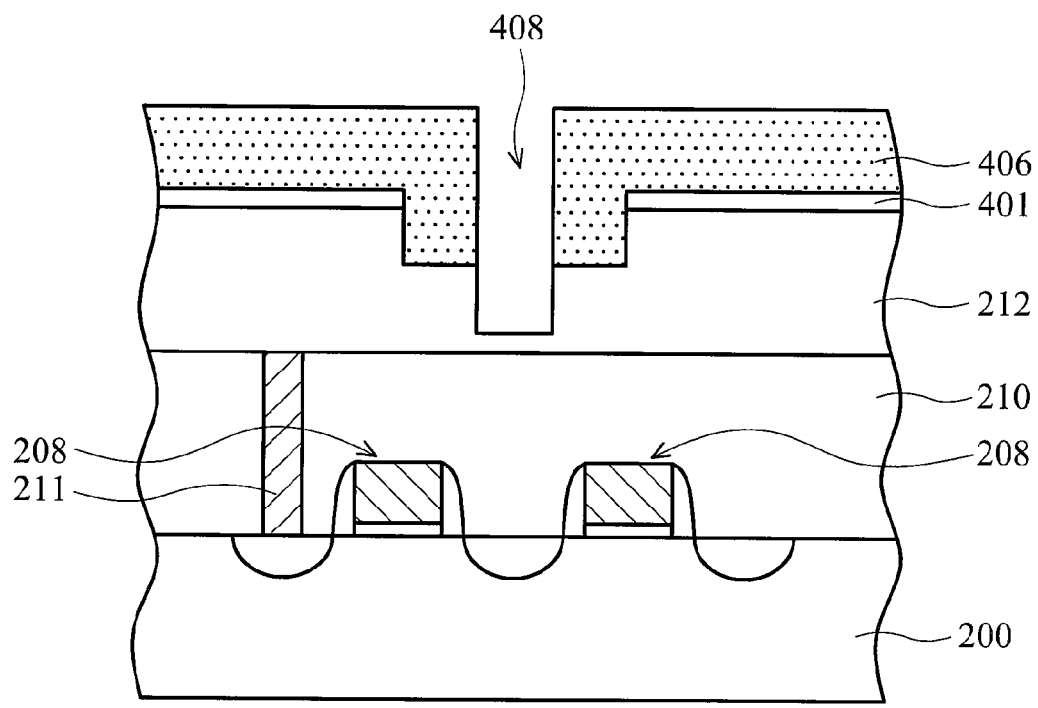
Figure 4C:
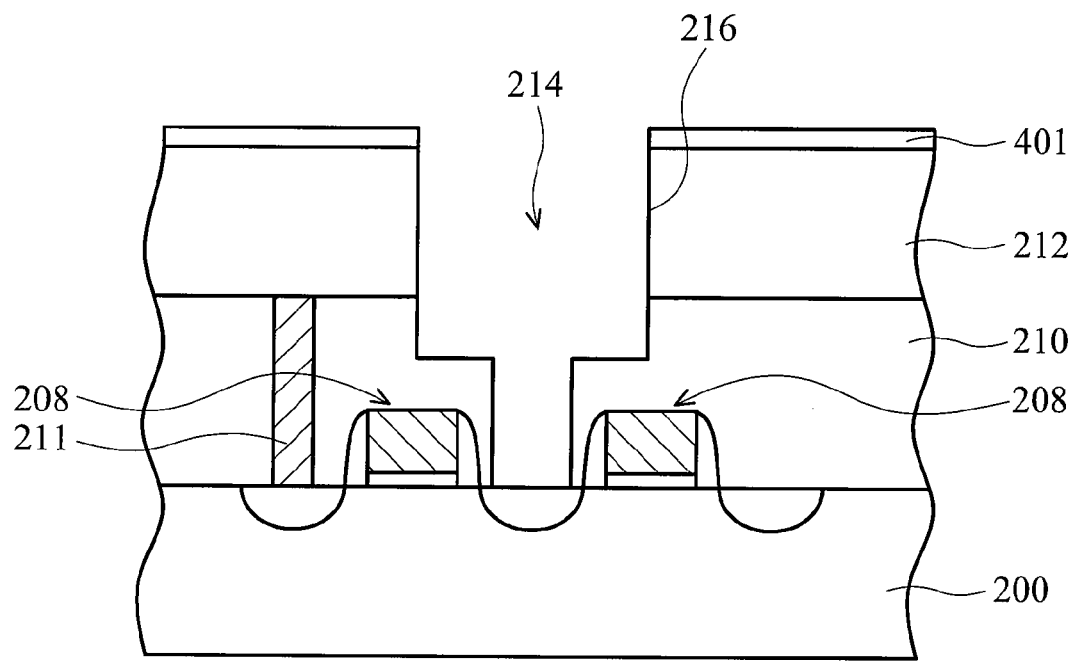

FIGS. 4A through 4C show cross-sections of another embodiment of a method for forming the contact and trench openings 214 and 216 shown in FIG. 2C. In FIG. 4A, an antireflection layer (ARL) 401, such as a silicon nitride (SiN) or silicon oxynitride (SiON) layer can be formed on the second dielectric layer to serve as a hard mask for subsequent etching. A masking layer 402, such as a photoresist layer, is formed on the ARL 401 overlying the second dielectric layer 212. The masking layer 402 is subsequently patterned to form an opening therein for trench opening definition. The opening is transferred to the ARL 401 and the underlying second dielectric layer 212 by etching to form a first opening 404 therein. In FIG. 4B, after removal of the masking layer 402, another masking layer 406, such as a photoresist layer, is formed on the ARL 401 and fills the first opening 404. The masking layer 406 is subsequently patterned for contact opening definition, thus a relatively narrow opening with respect to the first opening 404 is formed in the masking layer 406 to expose the bottom of the first opening 404. Next, the relatively narrow opening is transferred to the second dielectric layer 212 by etching to form a second opening 408 therein. In FIG. 4C, after removal of the masking layer 406, the first and second openings 404 and 406 are further recessed by etching using the ARL 401 as an etch mask, to form the contact and trench openings 214 and 216.

Figure 5A:
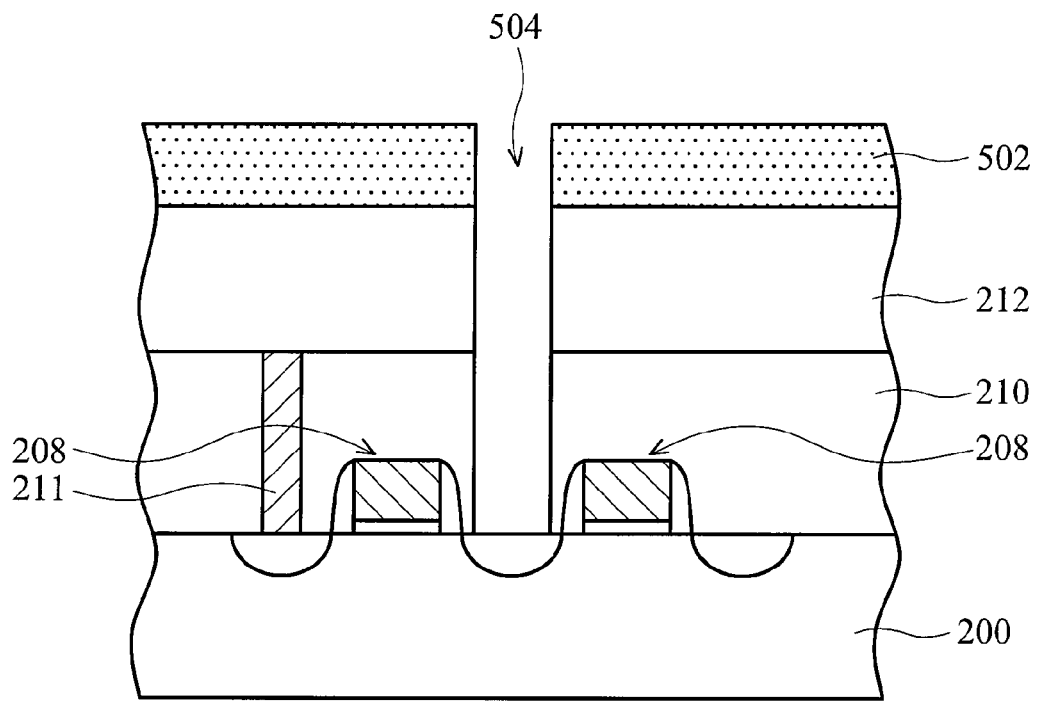
FIGS. 5A through 5C show cross-sections of another embodiment of a method for forming a dual damascene opening shown in FIG. 2C.
Figure 5B:
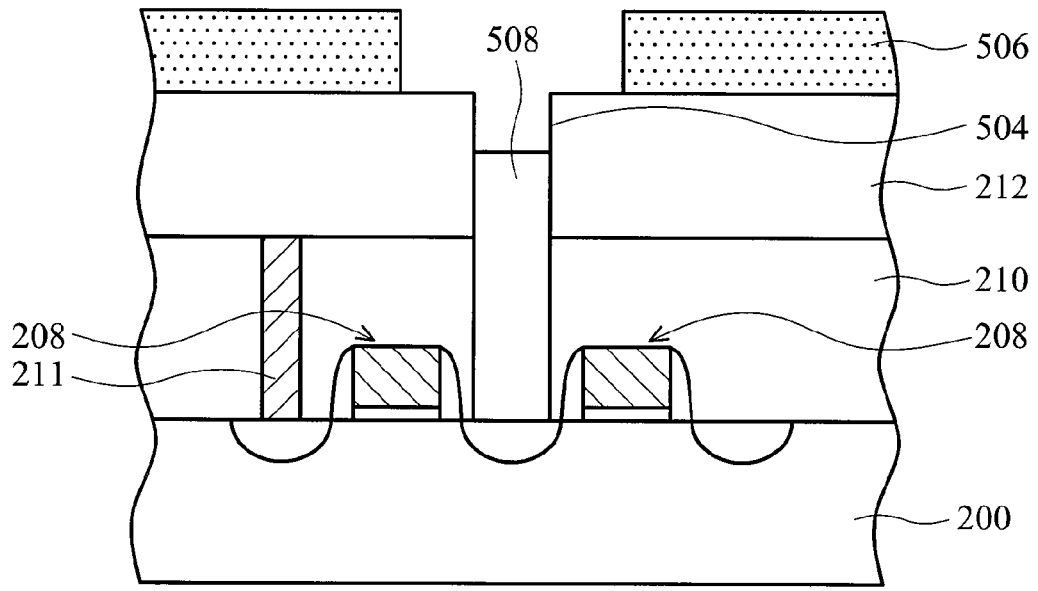
Figure 5C:
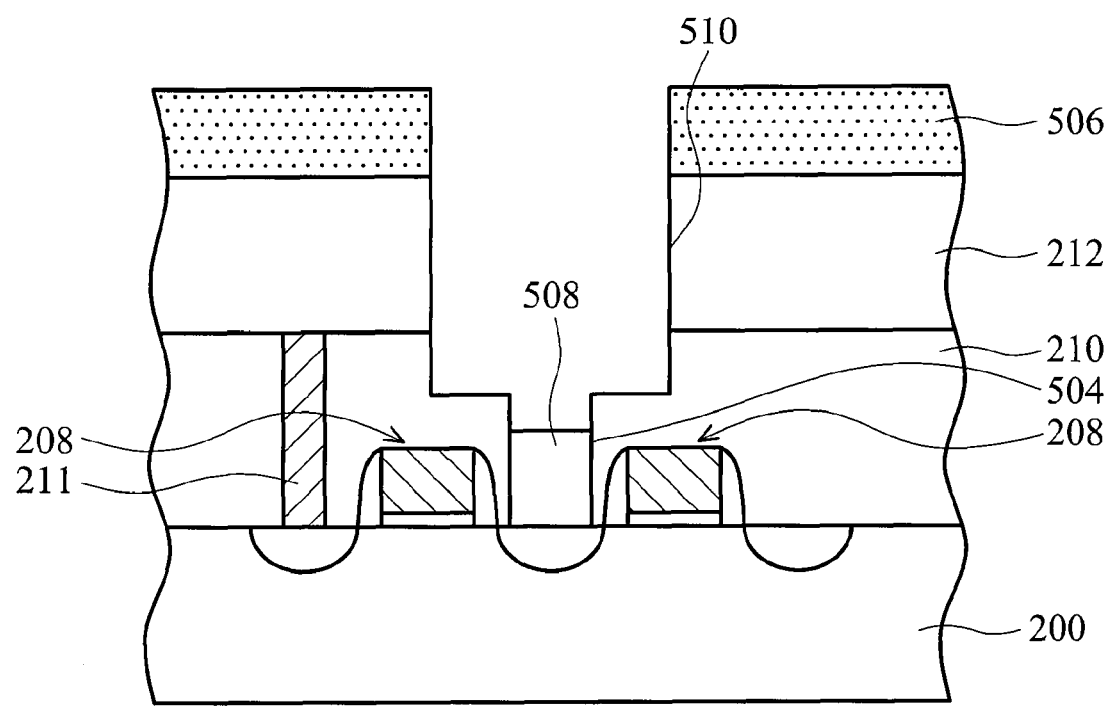

FIGS. 5A through 5C show cross-sections of another embodiment of a method for forming the contact and trench openings 214 and 216 shown in FIG. 2C. In FIG. 5A, a masking layer 502, such as a photoresist layer, is formed on the second dielectric layer 212. The masking layer 502 is subsequently patterned to form an opening therein for contact opening definition. The opening is transferred to the second dielectric layer 212 and the underlying first dielectric layer 210 by etching to form a first opening 504 exposing common source/drain region 201 between the pair of gate structures shown in FIG. 2C. In FIG. 5B, after removal of the masking layer 502, a sacrificial layer 508, such as bottom antireflection coating (BARC) or other suitable resist materials, is partially filled in the first opening 504. Thereafter, another masking layer 506, such as a photoresist layer, is formed on the second dielectric layer 212 and fills the first opening 504. The masking layer 506 is subsequently patterned for trench opening definition, thus a relatively wide opening with respect to the first opening 504 is formed in the masking layer 506. In FIG. 5C, the relatively wide opening is transferred to the second dielectric layer 212 by etching to form a second opening 510 above the first opening 504. A portion of the sacrificial layer 508 remains in the first opening 504. Also, the second opening 510 may be further recessed into a portion of the first dielectric layer 210 by etching to serve as the trench opening 216 shown in FIG. 2C. The first opening 504 under the second opening 510 serves as the contact opening 214 shown in FIG. 2C. Thereafter, the masking layer 506 and the remaining sacrificial layer 508 are removed, as shown in FIG. 2C.

Figure 6A:
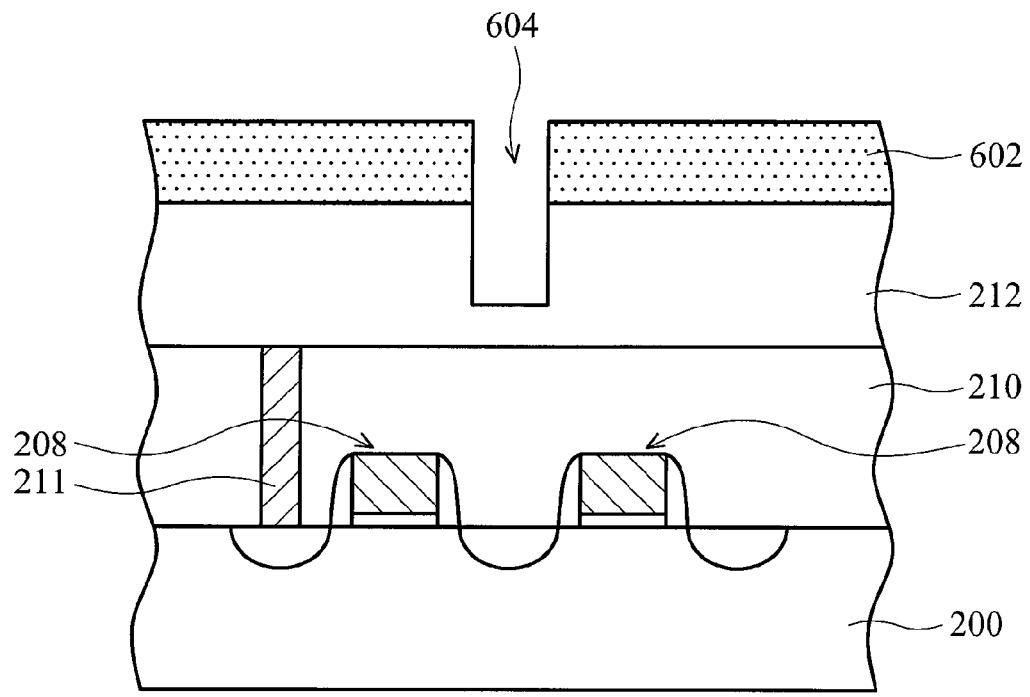
FIGS. 6A through 6C show cross-sections of another embodiment of a method for forming a dual damascene opening shown in FIG. 2C.
Figure 6B:
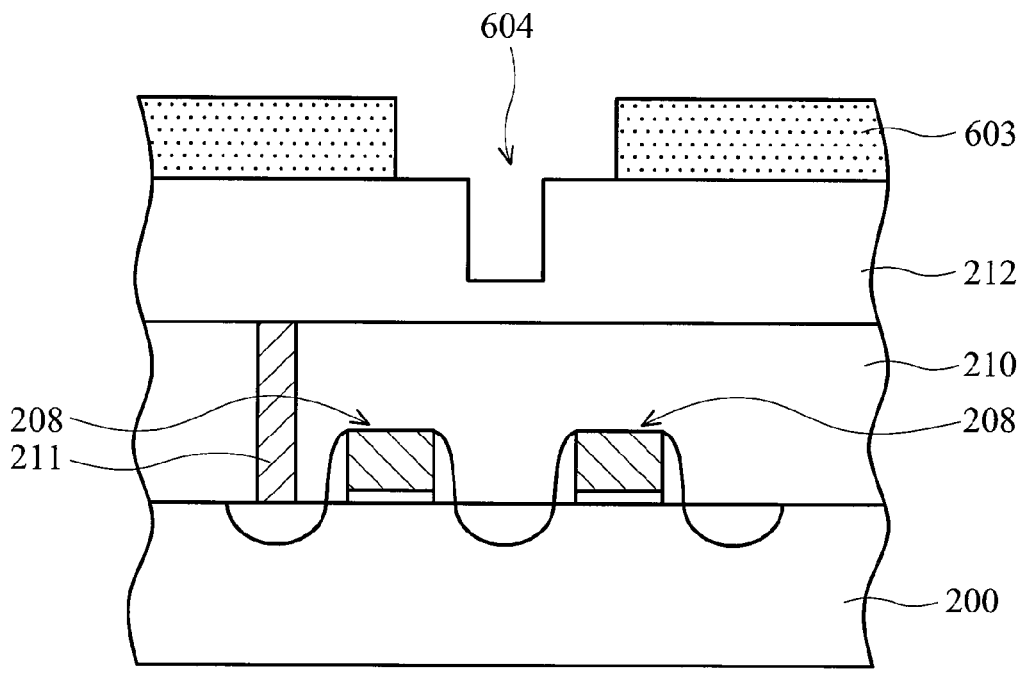
Figure 6C:
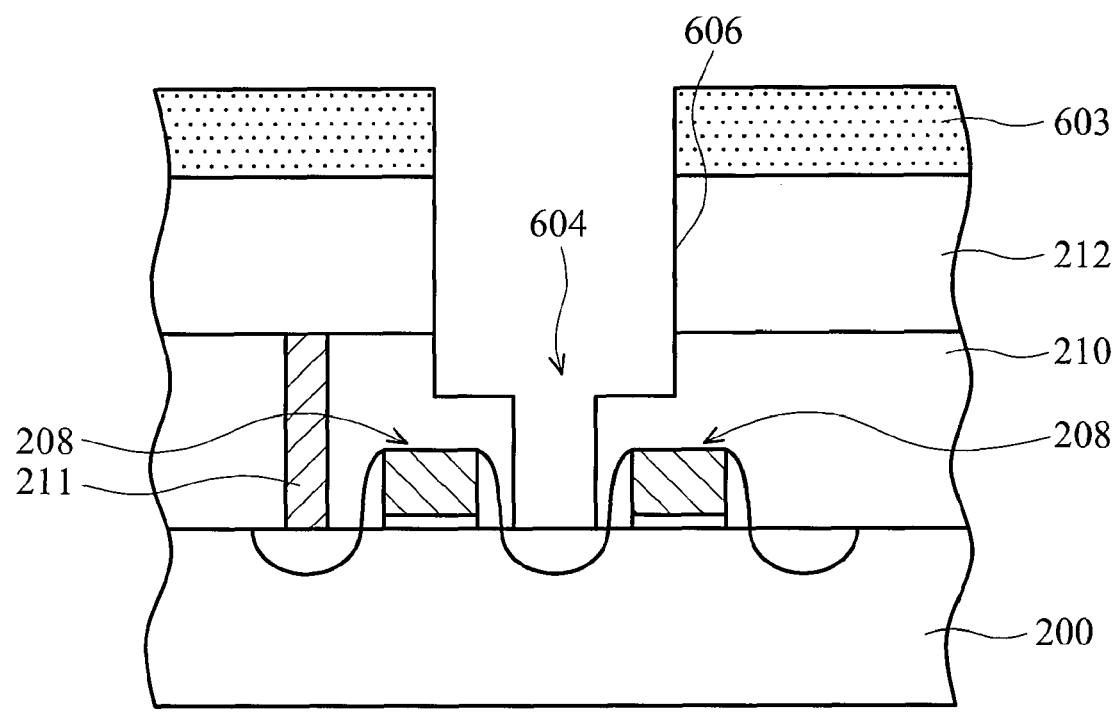

FIGS. 6A through 6C show cross-sections of another embodiment of a method for forming the contact and trench openings 214 and 216 shown in FIG. 2C. In FIG. 6A, a masking layer 602, such as a photoresist layer, is formed on the second dielectric layer 212. The masking layer 602 is subsequently patterned to form an opening therein for contact opening definition. The opening is transferred to the second dielectric layer 212 by etching to form a first opening 604. In FIG. 5B, after removal of the masking layer 602, another masking layer 603, such as a photoresist layer, is formed on the second dielectric layer 212 and fills the first opening 604. The masking layer 603 is subsequently patterned for trench opening definition, thus a relatively wide opening with respect to the first opening 604 is formed in the masking layer 603. In some embodiments, the opening in the masking layer 602 shown in FIG. 6A may be further pulled back to form a relatively wide opening with respect to the first opening 604 therein, thereby replacing the additional masking layer 603 shown in FIG. 6B. In FIG. 6C, the relatively wide opening is transferred to the second dielectric layer 212 by etching to form a second opening 606 above the first opening 604. Also, the second opening 606 may be further recessed into a portion of the first dielectric layer 210 by etching to serve as the trench opening 216 shown in FIG. 2C. The first opening 604 under the second opening 606 serves as the contact opening 214 shown in FIG. 2C. Thereafter, the masking layer 603 or the masking layer 602 after being pulled back is removed, as shown in FIG. 2C.

Turning to FIGS. 2D through 2F, an embedded capacitor 224 is formed in the contact and trench openings 214 and 216. In FIG. 2D, a metal layer (not shown) comprising a metal diffusion barrier material, such as tantalum (Ta), tantalum nitride (TaN), titanium (Ti), titanium nitride (TiN) or a combination thereof, is formed on the second dielectric layer 212 and conformally over the sidewalls and bottoms of the contact and trench openings 214 and 216, such that the pair of the transistor 208 is electrically connected to the metal layer. The excess metal layer on the second dielectric layer 212 is removed by chemical mechanical polishing (CMP), to leave a portion of metal layer 218 over the sidewalls and bottoms of the contact and trench openings 214 and 216. The remaining metal layer 218 serves as a bottom metal electrode layer. The bottom metal electrode layer 218 may be formed by, for example, atomic layer deposition (ALD), metal organic chemical vapor deposition (MOCVD), sputtering, or other suitable deposition. Preferably, the bottom metal electrode layer 218 is formed by ALD and has a thickness of about 50 Å to 400 Å.

Next, a high K dielectric layer 219, such as $Ta_2O_5$, $HfO_2$, $ZrO_2$, or $Al_2O_3$, and a metal layer 221, such as copper (Cu), aluminum (Al), tantalum (Ta), tantalum nitride (TaN), titanium (Ti), titanium nitride (TiN) or other well known metal electrode material are successively formed on the second dielectric layer 212 and conformally covers the bottom metal electrode layer 218, as shown in FIG. 2E. In FIG. 2F, the metal layer 221 and the underlying high K dielectric layer 219 are subsequently patterned by conventional lithography and etching, to leave portions of the metal layer 222 and the high K dielectric layer 220 on the bottom metal electrode layer 218 and partially covering the top surface of the second dielectric layer 212. The remaining metal layer 222 and high K dielectric layer 220 serve as a top metal electrode layer and a capacitor dielectric layer, respectively.

In FIG. 2G, a capping layer 226 is deposited on the second dielectric layer 212 and fills the trench and contact openings 216 and 214 to cover the embedded capacitor 224 by conventional deposition technology. For example, the capping layer 226 may comprise the same material as the ILD layer or different material therefrom, such as boron phosilicate glass (BPSG) or phososilicate glass (PSG). Thereafter, a masking layer 228, such as a photoresist layer, is formed on the capping layer 226. Next, the masking layer 228 is patterned to form an opening above the plug 211 and exposing the capping layer 226. The exposed capping layer 226 and the underlying second dielectric layer 212 are successively etched to form a contact opening 230 therein and expose the plug 211.

In FIG. 2H, after removal of the masking layer 228 shown in FIG. 2G, a conductive material is filled in the contact opening 230 to form a plug 231 in contact with the plug 211. The plugs 211 and 231 serve as the bit line contact. The conductive material may comprise tungsten (W), copper (Cu), aluminum (Al) or doped polysilicon, and tungsten is preferred. A conductive layer (not shown), such as a doped polysilicon layer, is formed on the capping layer 226 and covers the plug 231. Thereafter, the conductive layer is patterned to form a bit line 232 electrically connected to the underlying plugs 231 and 211, thus a DRAM cell of the invention is complete.

According to the invention, since the bottom metal electrode layer of the capacitor extends along the contact opening to replace a capacitor node plug formed between the capacitor and the transistor, the leakage current problem can be prevented, thereby increasing DRAM cell refresh time and device reliability. Moreover, since the area of the metal electrode layer is increased by extending the metal electrode layers and capacitor dielectric layer into the contact opening, the capacitance of the embedded capacitor can be further increased to increase memory capacity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device with an embedded capacitor structure, comprising:
    a dielectric layer disposed on a substrate, having a non-self-aligned contact opening exposing the substrate and a trench opening above the non-self-aligned contact opening;
    a first metal electrode layer conformally disposed over sidewalls and bottoms of the non-self-aligned contact and trench openings;
    a pair of adjacent transistors disposed on the substrate on both sides of the non-self-aligned contact opening and electrically connected to the first metal electrode layer;
    a second metal electrode layer inside of the contact and trench openings, conformally disposed over the sidewalls and bottoms of the non-self-aligned contact and trench openings and without entirely filling the contact and trench openings; and
    a capacitor dielectric layer interposed between the first and second metal electrode layers.

2. The semiconductor device as claimed in claim 1, further comprising:
    a first plug disposed in the lower portion of the dielectric layer, electrically connected to one of the pair of adjacent transistors;
    a capping layer disposed on the dielectric layer and covering the second metal electrode layer;
    a second plug disposed in the capping layer and the upper portion of the dielectric layer and in contact with the first plug; and
    a conductive layer disposed on the capping layer and electrically connected to the second plug.

3. The semiconductor device as claimed in claim 1, wherein the first metal electrode layer comprises a metal diffusion barrier material.

4. The semiconductor device as claimed in claim 3, wherein the first metal electrode layer comprises titanium nitride.

5. The semiconductor device as claimed in claim 1, wherein the second metal electrode layer comprises titanium nitride.

* * * * *